United States Patent [19]

Lischke

[11] Patent Number: 4,573,008
[45] Date of Patent: Feb. 25, 1986

[54] METHOD FOR THE CONTACT-FREE TESTING OF MICROCIRCUITS OR THE LIKE WITH A PARTICLE BEAM PROBE

[75] Inventor: Burkhard Lischke, Munich, Fed. Rep. of Germany

[73] Assignee: Siemens Aktiengesellschaft, Berlin & Munich, Fed. Rep. of Germany

[21] Appl. No.: 501,089

[22] Filed: Jun. 6, 1983

[30] Foreign Application Priority Data

Sep. 24, 1982 [DE] Fed. Rep. of Germany ....... 3235461

[51] Int. Cl.$^4$ ............................................. G01R 31/02
[52] U.S. Cl. .................................. 324/158 R; 324/51; 324/73 PC
[58] Field of Search .......... 324/158 R, 158 D, 73 PC, 324/51; 250/310

[56] References Cited

U.S. PATENT DOCUMENTS 3,531,716  9/1970  Tarui et al. ................. 324/158 R X
4,415,851 11/1983  Langner et al. ............ 324/158 R X
4,417,203 11/1983  Pfeiffer et al. ................. 324/158 R

FOREIGN PATENT DOCUMENTS 55-76561  6/1980  Japan ................................. 250/310

OTHER PUBLICATIONS

Vac. Sci. Technol., vol. 19, No. 4, Nov./Dec., 1981 by H. C. Pfeiffer et al., "Contactless Electrical Testing", p. 1016.

Primary Examiner—Stewart J. Levy
Assistant Examiner—Stephen M. Baker
Attorney, Agent, or Firm—Hill, Van Santen, Steadman & Simpson

[57] ABSTRACT

A method for the contactless testing of an object, particularly microcircuits, employs a particle beam probe to permit a resistance determination in a load-free fashion and without chronological variations of the charge state of the object. A first measuring spot is irradiated with a write beam of approximately a primary electron energy $E_{PE}=2E_o$, whereby $E_o$ is that particular energy at which the number of charges leaving the object is equal to the number of charges incident on the object. Then an additional measuring spot is checked as to whether it exhibits a conductive connection with the first measuring spot. The second measuring spot can be checked as to whether a specimen current is flowing. On the second measuring spot a read current of approximately a primary electron energy $E_{PE}=E_o$ can be directed. The number of secondary electrons detected with a detector then serves the purpose of determining whether a conductive connection exists between the first measuring spot and the secondary measuring spot.

4 Claims, 4 Drawing Figures

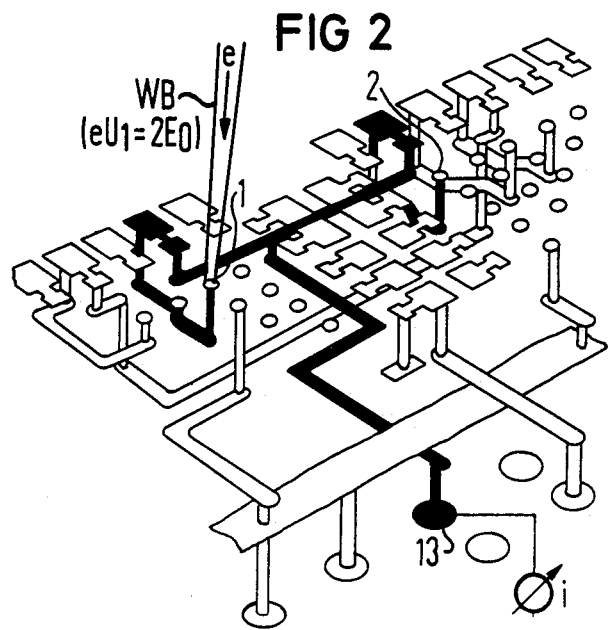
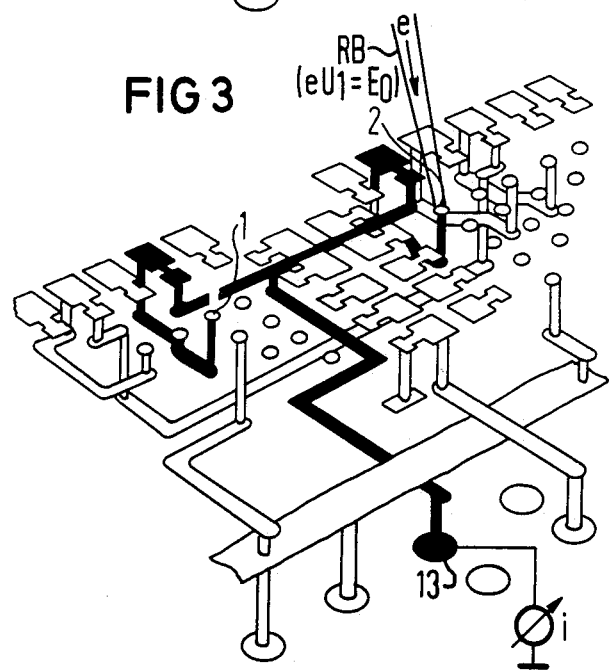

METHOD FOR THE CONTACT-FREE TESTING OF MICROCIRCUITS OR THE LIKE WITH A PARTICLE BEAM PROBE

BACKGROUND OF THE INVENTION

The invention relates to a method for the contact-free testing of an object, particularly microcircuits with a particle beam probe of a type well known in the prior art as described hereafter.

Structures which are becoming increasingly more detailed and small in printed circuit boards make it imperative to develop alternative test methods for the electric testing of microcircuits. For the electric continuity testing of microcircuits with mechanical needle adapters, given a reference grid scale of a printed circuit board of approximately 200 $\mu$m or less, the limit is reached for the use of such mechanical needle adapters.

Alternative test methods with the aid of electron probes are known from the state of the art. For example, such a test method for the testing of microcircuits with an electron probe is known in which the resistance measurement of a printed conductor proceeds such that, with a first electron beam, a charge and hence a potential is impressed on one end of the printed conductor. If a conductive connection to the other end of this printed conductor exists then this other end of the printed conductor assumes the same potential, which can be checked with a second electron beam. This second electron beam is directed to the other end of the printed conductor. From this magnitude of the secondary electron signal then picked up from the other end of the printed conductor it can then be determined whether a conductive connection exists between the two ends of the printed conductor. This method exhibits the disadvantage that, in practice, it proves difficult to simultaneously produce two electron probes with varying energy and which are spatially closely adjacent to one another.

From Vac. Sci. Techol., Vol. 19, No. 4, November/December 1981, page 1016, incorporated herein by reference, an apparatus proposed by H. C. Pfeiffer et al with a total of 3 electron beam generators is known which permits a method for testing microcircuits with electron probes which can be practically carried out. In the case of this known method, with a first electron probe the specimen is charged and, with a second electron probe, the potential at one end of the printed conductor is altered in order to then determine with an electron probe the potential variation at the other end of the printed conductor. In the case of this known method, it turns out to be disadvantageous that the resistance of the printed conductor must be determined from a chronological potential variation and that, in the case of this known method, up to three electron beam generators are necessary.

The methods cited in the state of the art have the disadvantage that they do not operate in a load-free fashion, and that simultaneously the resistance of a printed conductor must be determined from the chronological variation of the charge state of the printed conductor.

SUMMARY OF THE INVENTION

An object underlying the present invention is to permit a resistance determination in a load-free fashion and without chronological variations of the charge state of an object.

This objective is achieved by irradiating a first measuring spot of the electronic microcircuitry with a light beam generated by the particle beam probe of approximately a primary electron energy $E_{PE}=2E_o$, where $E_o$ is that particular energy at which a number of charges leaving the first measuring spot is equal to a number of charges incident on the first measuring spot. A second measuring spot of the microelectronic circuitry is checked as to whether it exhibits a conductive connection with the first measuring spot. In checking whether the second measuring spot is conductively connected with the first measuring spot, a read beam generated by the particle beam probe is directed on the second measuring spot, the beam having a primary electron energy $E_{PE}=E_o$, and that a number of secondary electrons detected with a detector serves to determine whether the conductive connection exists between the first measuring spot and the second measuring spot.

For a practical realization of the method of the invention only a single electron beam generator is required which can generate electron beams with the energy $2E_o$ and $E_o$. With the invention, the resistance measurement of an object takes place in a load-free fashion. It is therefore not necessary to detect rapid potential variations by measurement. Through a corresponding design of the detector for the secondary electrons, in the case of an apparatus for carrying out the invention a good signal-to-noise ratio can be achieved.

BRIEF DESCRIPTION OF THE DRAWINGS

FIG. 2 shows the principle of a method of the invention for testing a conductive connection from top to bottom in the case of a printed circuit board;

FIG. 3 shows the principle of a method of the invention for checking a connection in the upper plane of a printed circuit board.

DESCRIPTION OF THE PREFERRED EMBODIMENTS

Figure 1:
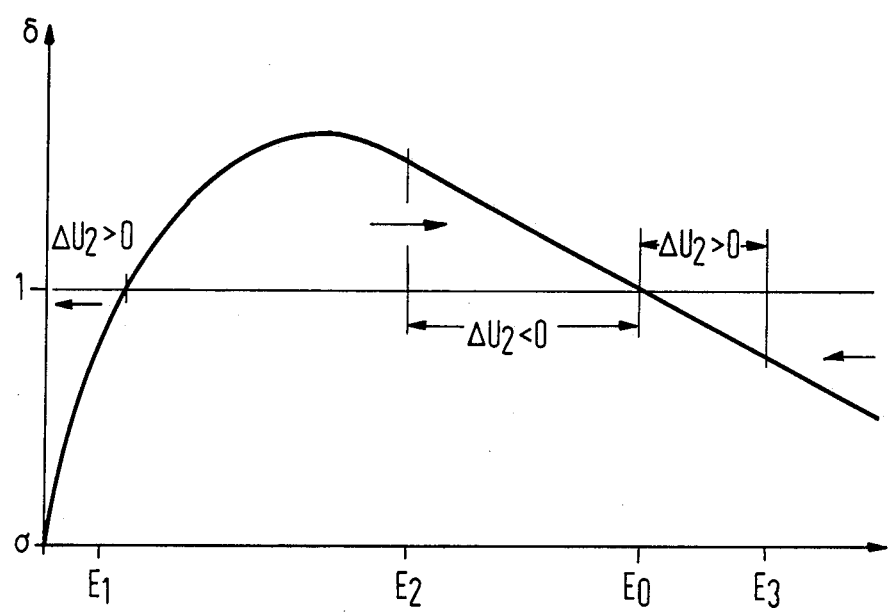
FIG. 1 shows a curve for the graphic determination of electron yield associated with the stationary charging of a specimen to the potential $-U_2$ by radiation with an electron probe.

FIG. 1 shows a curve for the graphic determination of the stationary charge of a specimen to the potential $-U_2$ with irradiation of the specimen with an electron probe. The primary electrons, when they have left the electron beam generating system, have a primary energy of $E_{PE}=eU_1$. In the stationary or steady state these primary electrons impinge upon a specimen which exhibits an energy of $E_{PR}=eU_2$. In the stationary or steady state case, the primary electrons are retarded through the countervoltage $U_2$ before they impinge on the specimen. The primary electrons therefore impinge on the specimen with an energy of $E=E_{PE}-E_{PR}=e(U_1-U_2)$ FIG. 1 shows the total electron yield $\sigma$ in dependence upon this impinging energy of the primary electrons on the specimen.

On the surface of the specimen a positive charge can develop in case more electrons leave the surface of the specimen than remain in the specimen ($\sigma>1$). If a large portion of the primary electrons remains beneath the surface of the specimen a negative space charge can be produced which also can penetrate to the surface of the specimen ($\sigma<1$). If a specimen has been charged through irradiation with an electron probe then, in the stationary case, the number of electrons leaving the specimen is equal to the number of electrons incident upon the specimen: $\sigma=1$. The electrons leaving the specimen can thus leave the specimen in the form of secondary electrons, or in the form of back-scatter electrons, or in a probe current.

If, for example, the impinging energy E of the primary electrons on the specimen amounts to $E=E_1$ and if the specimen potential of the specimen is initially $-U_2=0$, then, prior to attainment of the stationary state, the electron yield is $\sigma<1$ and the specimen charges itself negatively until a countervoltage $U_2=E_1/e$ has been built up on the specimen. Then the stationary state has been reached and the primary electrons are entirely retarded by the negative specimen; the impinging energy E of the primary electrons, in the case of this stationary state, is zero and hence also the electron yield is $\sigma=0$.

If the impinging energy E of the primary electrons amounts to $E=E_2$ then the electron yield upon commencement of the charging of the specimen is $\sigma>1$ and the specimen becomes positively charged until, in the stationary instance, a countervoltage $U_2=(E_2-E_o)/e$ is reached, whereby $E_o$ signifies the upper impinging energy of the primary electrons on the specimen at which $\sigma=1$ applies to the electron yield. A correspondingly negative charging of the specimen in the stationary instance results given an impinging energy of the primary electrons on the specimen of $E=E_3$. The countervoltage then amounts in this case to $U_2=(E_3-E_o)/e$.

The curve for the electron yield $\sigma$ is dependent upon the material of the specimen. For insulated specimens generally the impinging energy $E_o$ of the primary electrons, at which $\sigma=1$ applies to the electron yield, lies approximately between 1 keV and 4 keV. With a given energy $E_{PE}$ of the primary electrons the potential $-U_2$ on the specimen changes until either the stationary state with the electron yield $\sigma=1$ given the impinging energy $E_o$ is present or until the stationary state $\sigma=0$ given an impinging energy $E=0$ is present.

FIG. 2 shows the principle of a method of the invention for the testing of a conductive connection in the case of microcircuits on a printed circuit board from top to bottom. The measuring spot 1 is irradiated with a writing beam WB with the primary energy $E_{PE}=eU_1=2E_o$. If a conductive connection is to be tested from top to bottom, namely from the measuring spot 1 to the contact 13, this testing can take place via the flowing specimen current on the contact 13.

In the stationary irradiation state the primary electrons exhibit an impinging energy E on the specimen of $E=E_o$. In this stationary state with the electron yield $\sigma=1$, the countervoltage then amounts to $U_2=(2E_o-E_o)/e=E_o/e$. The measuring spot 1 has thus become negatively charged to the voltage $-U_2$.

FIG. 3 shows the principle of a method of the invention for the checking of a conductive connection in the upper plane, for example of a printed circuit board. After completed charging of the measuring spot 1 to the potential $-U_2=-E_o/e$, the write beam WB can now be switched over to a read beam RB since the energy of the primary electrons $E_{PE}=eU_1=2E_o$ is switched over to the value $E_{PE}=E_o$ and is simultaneously directed to the measuring spot 2 for the purpose of scanning or sampling the potential of this measuring spot 2. In the case of an undisturbed conductive connection between the measuring spots 1 and 2, the measuring spot 2 is now also charged to the potential $-U_2=-E_o/e$. In this case, the impinging energy E of the primary electrons on the measuring spot 2 is equal to zero and thus also the electron yield is $\sigma=0$. This signifies that no secondary electrons are released. This furthermore indicates that the image of the measuring spot 2 appears dark on a viewing screen connected to the secondary electron detector. For the case in which the conductive connection between the measuring spot 1 and the measuring spot 2 is disturbed, the measuring spot 2 has not become charged. Thus, the potential of the measuring spot 2 amounts to $-U_2=0$ so that the impinging energy E of the primary electrons on the specimen amounts to $E=E_o$. This leads to an electron yield $\sigma=1$. In this case the image of the measuring spot 2 appears bright on a viewing screen connected to the secondary electron detector.

The electron beam probe utilized with this invention is well known in the prior art and is described, for example, in U.S. Ser. No. 284,827 filed July 20, 1981—Feuerbaum et al, or in U.S. Pat. No. 4,277,679, respectively, incorporated herein by reference. The electron beam probe is also described in the H. P. Feuerbaum article, "VLSI Testing Using The Electron Probe", SEM/1979/Vol. 1, pages 285–296, (1979), incorporated herein by reference. The disclosure of the aforementioned U.S. patent application is taken from the Feuerbaum 1979 SEM article. The aforementioned particle beam probe description also describes appropriate detector systems for analyzing the secondary electron emissions.

Figure 4:
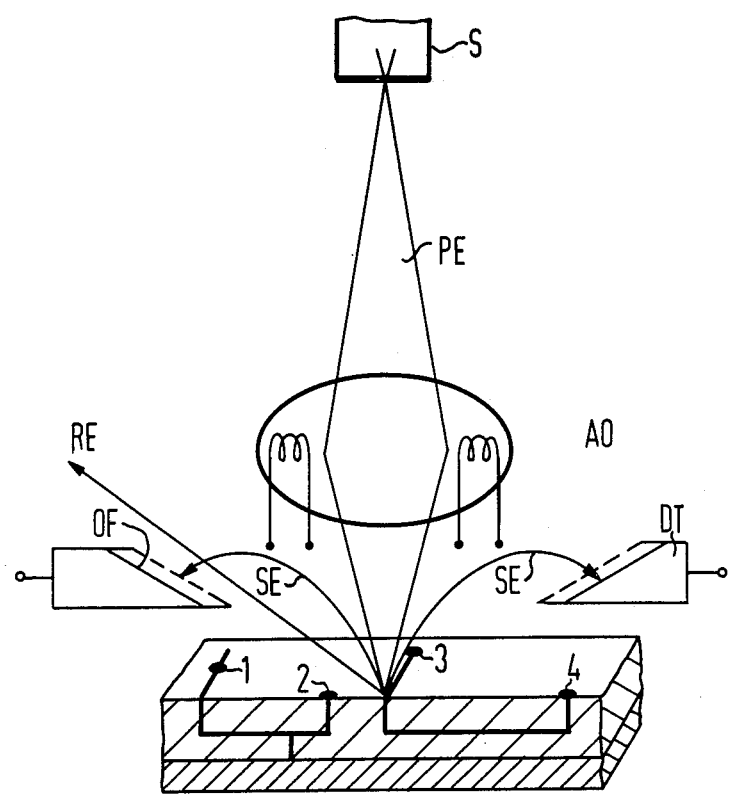
FIG. 4 shows a corresponding detector geometry for guaranteeing a good signal-to-noise ratio in the case of an apparatus for carrying out the inventive method.

FIG. 4 shows the principle of a secondary electron spectrometer in which, by means of a corresponding detector geometry, a good signal-to-noise ratio can be obtained. The primary electrons PE issuing from an electron beam generating system S traverse a deflection lens AO and then impinge on the surface, for example, of a printed circuit board with the measuring spots 1, 2, 3, 4. The surface of the detector DT, which is sensitive for the detection of slow secondary electrons SE, is to be suitably matched to the specimen geometry.

While various minor changes and modifications might be proposed by those skilled in the art, it will be understood that I wish to include within the claims of the patent warranted herein all such changes and modifications as reasonably come within my contribution to the art.

I claim as my invention:
1. A method for non-contact testing of a specimen including microcircuitry, comprising the steps of:
   providing a particle beam;
   charging a first point of the specimen with the particle beam;
   after a steady state condition has been achieved at the first point, varying an energy of the particle beam such that it lies in a region of a neutral point energy $E_o$ where a number of electrons leaving the specimen is substantially equal to a number of electrons incident upon the specimen;
   subsequently directing said particle beam with energy $E_o$ to at least one further point; and
   interrogating potential of said further point by detection of triggered secondary electrons by use of a detector without changing a charge condition of the specimen.

2. A method according to claim 1 wherein subsequent to charging of the first point another point of the specimen is subsequently checked to see whether a test current I is flowing.

3. A method according to claim 1 wherein when charging the first point the particle beam initially has an energy corresponding to twice said neutral point energy $E_o$.

4. A method according to claim 1 including the step of measuring the first point and further point at a same side of the specimen.

* * * * *